United States Patent
Kim (10) Patent No.: US 7,573,308 B2
(45) Date of Patent: Aug. 11, 2009

(54) DELAY LOCKED LOOP CIRCUIT FOR PREVENTING MALFUNCTION CAUSED BY CHANGE OF POWER SUPPLY VOLTAGE

(75) Inventor: Kyoung-Nam Kim, Kyoungki-do (KR)

(73) Assignee: Hynix Semiconductor, Inc., Gyeonggi-do (KR)

(*) Notice: Subject to any disclaimer, the term of this patent is extended or adjusted under 35 U.S.C. 154(b) by 75 days.

(21) Appl. No.: 11/647,219

(22) Filed: Dec. 29, 2006

(65) Prior Publication Data
US 2008/0122502 A1 May 29, 2008

(30) Foreign Application Priority Data
Aug. 24, 2006 (KR) .................... 10-2006-0080713

(51) Int. Cl.
*H03L 7/06* (2006.01)
(52) U.S. Cl. ..................... 327/158; 327/149
(58) Field of Classification Search ......... 327/147–153, 327/151–161
See application file for complete search history.

(56) References Cited

U.S. PATENT DOCUMENTS

| | | | | |
|---|---|---|---|---|
| 4,758,821 | A * | 7/1988 | Nelson et al. | 341/157 |
| 6,075,832 | A * | 6/2000 | Geannopoulos et al. | 375/375 |
| 6,486,716 | B1 * | 11/2002 | Minami et al. | 327/152 |
| 6,518,807 | B1 * | 2/2003 | Cho | 327/158 |
| 6,774,690 | B2 * | 8/2004 | Baker et al. | 327/158 |
| 7,046,059 | B2 * | 5/2006 | Kwak | 327/158 |
| 7,057,431 | B2 * | 6/2006 | Kwak | 327/158 |
| 7,233,183 | B1 * | 6/2007 | Sancheti | 327/158 |
| 7,336,752 | B2 * | 2/2008 | Vlasenko et al. | 375/376 |
| 7,348,823 | B2 * | 3/2008 | Takai et al. | 327/291 |
| 7,358,784 | B2 * | 4/2008 | Kim et al. | 327/158 |
| 2003/0218486 | A1 * | 11/2003 | Kwak | 327/158 |
| 2004/0113665 | A1 * | 6/2004 | Joet al. | 327/156 |
| 2004/0125905 | A1 * | 7/2004 | Vlasenko et al. | 375/376 |

(Continued)

FOREIGN PATENT DOCUMENTS

JP 2004-056172 2/2004

(Continued)

OTHER PUBLICATIONS

Notice of Allowance issued in Korean Patent Application No. KR 10-2006-0080713, dated on May 29, 2008.

*Primary Examiner*—Lincoln Donovan
*Assistant Examiner*—Adam D Houston
(74) *Attorney, Agent, or Firm*—Mannava & Kang, P.C.

(57) ABSTRACT

A Delay Locked Loop (DLL) circuit prevents a malfunction caused by a change of a power supply voltage, and includes a first and a second delay lines and a first and a second signal processors for controlling the first and the second delay lines, and turns off the second signal processor after DLL locking. The DLL circuit further includes a phase comparator for generating a comparison signal notifying which of phases of a first clock signal of the first delay line and a second clock signal of the second delay line precedes the other, and a signal selector for inputting an output of the second signal processor to the second delay line before the DLL locking, and inputting the comparison signal of the phase comparator to the second delay line after the DLL locking.

14 Claims, 7 Drawing Sheets

U.S. PATENT DOCUMENTS

| | | | |
|---|---|---|---|
| 2004/0130366 A1* | 7/2004 | Lin et al. | 327/158 |
| 2004/0217789 A1* | 11/2004 | Kwak et al. | 327/158 |
| 2005/0093597 A1* | 5/2005 | Kwak | 327/158 |
| 2005/0093600 A1* | 5/2005 | Kwak | 327/161 |
| 2007/0069781 A1* | 3/2007 | Kim et al. | 327/158 |
| 2007/0069783 A1* | 3/2007 | Ku et al. | 327/158 |
| 2007/0085581 A1* | 4/2007 | Ku | 327/158 |
| 2008/0042705 A1* | 2/2008 | Kim et al. | 327/158 |
| 2008/0180149 A1* | 7/2008 | Byun | 327/158 |

FOREIGN PATENT DOCUMENTS

| | | |
|---|---|---|
| KR | 10-2004-0041985 | 5/2004 |
| KR | 10-2004-0095981 | 11/2004 |
| KR | 10-2005-0048838 | 5/2005 |

* cited by examiner

DELAY LOCKED LOOP CIRCUIT FOR PREVENTING MALFUNCTION CAUSED BY CHANGE OF POWER SUPPLY VOLTAGE

CROSS-REFERENCE TO RELATED APPLICATIONS

The present invention claims priority of Korean patent application number 10-2006-0080713, filed in the Korean Patent Office on Aug. 24, 2006, which is incorporated by reference in its entirety.

BACKGROUND OF THE INVENTION

The present invention relates to a Delay Locked Loop (DLL); and, more particularly, to a DLL circuit used in a semiconductor device and a computer system which need a clock generating device for compensating for a skew between an external clock and an internal clock.

In general, a DLL is a circuit for synchronizing an internal clock of a synchronous type of memory using clocks with an external clock without any error in a semiconductor memory device. That is, when an external clock is input and is to be used as an internal clock, there occurs a timing delay. In such a case, the DLL serves to synchronize the internal clock with the external clock by controlling the timing delay.

Figure 1:
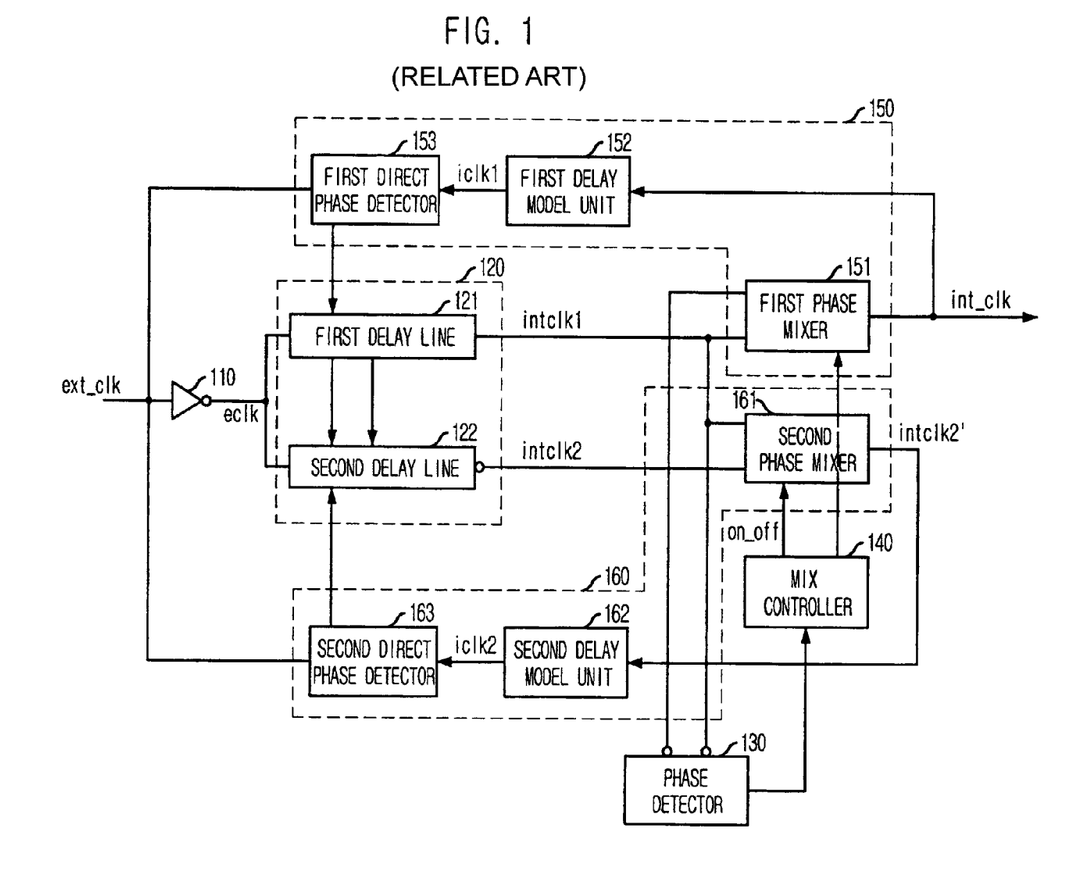
FIG. 1 is a block diagram of a conventional DLL circuit.

Korean Patent No. 10-0515071 discloses a DLL for reducing power consumption. FIG. 1 is a block diagram of a conventional DLL circuit disclosed in the above patent. The conventional DLL circuit includes a buffer 110, a delay line unit 120, a phase detector 130, a mix controller 140, and first and second signal processors 150 and 160.

The buffer 110 receives an external clock signal ext_clk, generates an input clock signal eclk activated at an edge of the external clock signal, and outputs the same to the delay line unit 120 to be discussed below.

The delay line unit 120 receives the input clock signal eclk from the buffer 110 and also receives first and second comparison signals from the first and the second signal processors 150 and 160 to be explained below. The delay line unit 120 delays the input clock signal eclk for a predetermined time, and outputs delayed clock signals to the first and the second signal processors 150 and 160, respectively.

More specifically, a first delay line 121 included in the delay line unit 120 takes the input clock signal eclk from the buffer 110, generates a first clock signal intclk1 by controlling a delay amount of the input clock signal eclk in response to the first comparison signal from the first signal processor 150 to be described below, and outputs the first clock signal intclk1 to the first signal processor 150.

In the meantime, a second delay line 122 provided in the delay line unit 120 accepts the input clock signal eclk from the buffer 110, generates a second clock signal intclk2 by controlling the delay amount of the input clock signal eclk in response to the second comparison signal from the second signal processor 160 and inverting the input clock signal eclk, and outputs the second clock signal intclk2 to the second signal processor 160.

The phase detector 130 receives inverted values of the first and the second clock signals intclk1 and intclk2 from the delay line unit 120, generates a phase detection signal notifying which of the falling edges of the first and the second clock signals intclk1 and intclk2 precedes the other, and provides the phase detection signal to the mix controller 140.

The mix controller 140 decides DLL locking or unlocking based on the first comparison signal from the first signal processor 150 and the second comparison signal from the second signal processor 160, which are not shown, outputs a weight K determined depending on the phase detection signal to the first and the second signal processors 150 and 160, and delivers an on/off signal on_off to the second signal processor 160 according to the DLL locking or unlocking. Here, the weight K includes a plurality of weight signals.

The first signal processor 150 receives the weight K and the first and the second clock signals intclk1 and intclk2, generates a first compensated clock signal iclk1 by using the weight and the clock signals; and takes the external clock signal ext_clk, generates the first comparison signal by comparing the external clock signal ext_clk with the first compensated clock signal iclk1, and outputs the first comparison signal to the delay line unit 120.

To be more specific, a first phase mixer 151 prepared in the first signal processor 150 receives the weight K from the mix controller 140, generates a first mixed clock signal int_clk having an adjusted duty by applying a value obtained by subtracting the weight K from '1' to the first clock signal intclk1 and applying the weight K to the second clock signal intclk2, and outputs the first mixed clock signal int_clk to a first delay model unit 152 contained in the first signal processor 150.

The first delay model unit 152 receives the first mixed clock signal int_clk having the adjusted duty from the first phase mixer 151, compensates for a time difference between the external clock and the internal clock, generates the first compensated clock signal iclk1, and provides it to a first direct phase detector 153 included in the first signal processor 150.

The first direct phase detector 153 accepts the external clock signal ext_clk, generates the first comparison signal by comparing the external clock signal ext_clk with the first compensated clock signal iclk1 from the first delay model unit 152, and outputs the first comparison signal to the delay line unit 120.

Meanwhile, the second signal processor 160 receives the weight K, and the first and the second clock signals intclk1 and intclk2 and generates a second compensated clock signal iclk2 by using the weight and the clock signals; and receives the external clock signal ext_clk, generates the second comparison signal by comparing the external clock signal ext_clk with the second compensated clock signal iclk2, and outputs the second comparison signal to the delay line unit 120, wherein the processor 160 is activated or inactivated in response to the on/off signal.

A second phase mixer 161 provided in the second signal processor 160 receives the weight K from the mix controller 140, generates a second mixed clock signal intclk2' having an adjusted duty by applying the weight K to the first clock signal intclk1 and applying a value obtained by subtracting the weight K from '1' to the second clock signal intclk2, and outputs the second mixed clock signal intclk2' to a second delay model unit 162 included in the second signal processor 160, wherein the second phase mixer 161 is activated or inactivated in response to the on/off signal.

The second delay model unit 162 receives the second mixed clock signal intclk2' having the adjusted duty from the second phase mixer 161, compensates for a time difference between the external clock and the internal clock, generates the second compensated clock signal iclk2, and outputs the same to a second direct phase detector 163 provided in the second signal processor 160.

The second direct phase detector 163 accepts the external clock signal ext_clk, generates the second comparison signal by comparing the external clock signal ext_clk with the second compensated clock signal iclk2 from the second delay model unit 162, and outputs the second comparison signal to the delay line unit 120.

Figure 2:
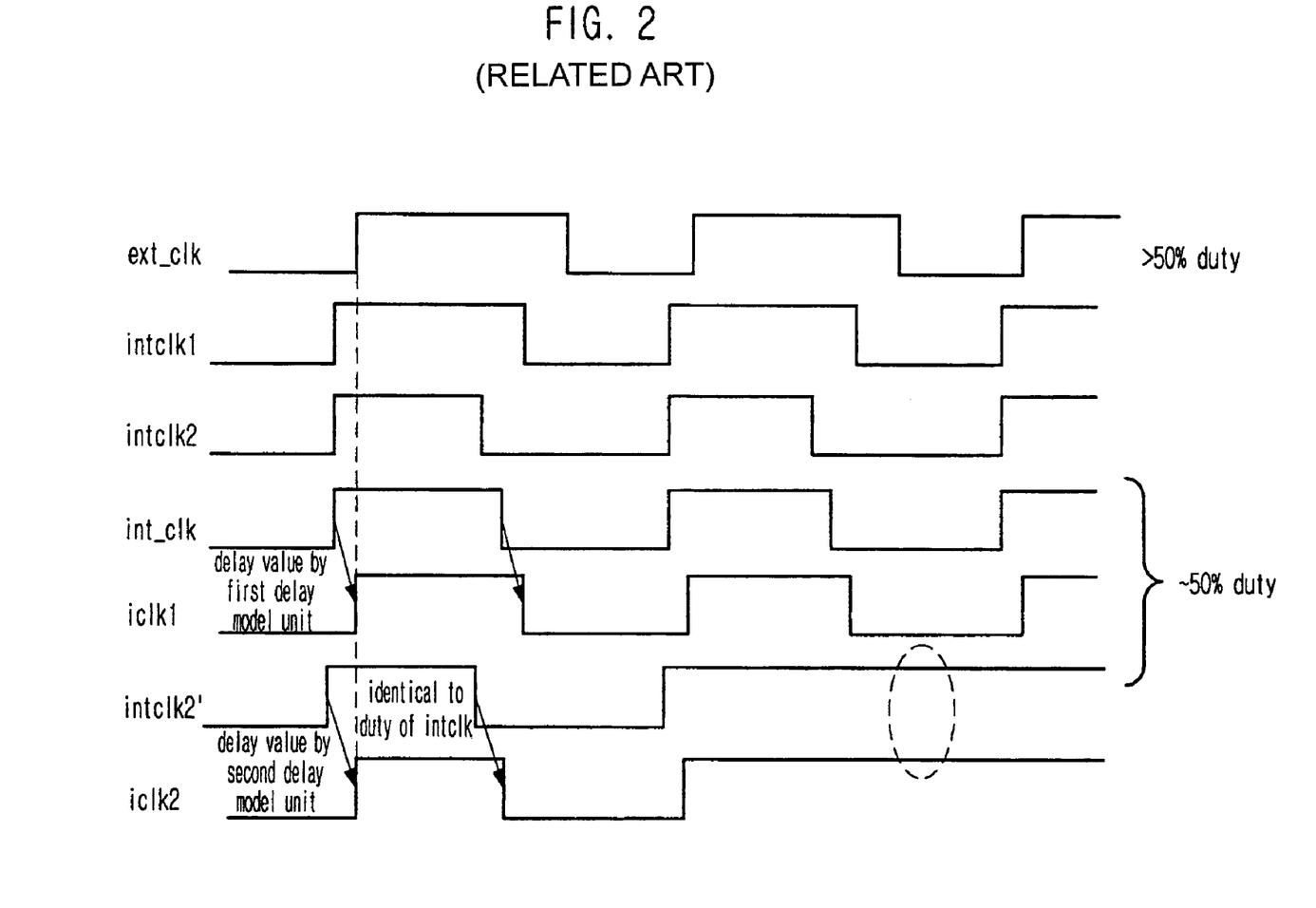
FIG. 2 is a timing diagram for operation of the DLL circuit of FIG. 1.

FIG. 2 is a timing diagram for operation of the DLL circuit shown in FIG. 1. First, upon completion of the DLL locking, phase-synchronized are not only the rising edges of the first and the second compensated clock signals iclk1 and iclk2 but also the rising edges of the first and the second clock signals intclk1 and intclk2 and those of the first and the second mixed clock signals int_clk and intclk2'. In order to continuously synchronize the rising edges of the first and the second clock signals intclk1 and intclk2, the second direct phase detector 163 is turned off and only the first direct phase detector 153 is turned on to control all of the two delay lines 121 and 122 included in the delay line unit 120, from the time when the DLL locking is established.

For example, when the rising edge of the first mixed clock signal int_clk lags that of the external clock signal ext_clk due to an external factor, the first direct phase detector 153 checks the phase relation therebetween and transmits a command of reducing the delay to the two delay lines 121 and 122. When the delay is reduced in the delay line unit 120 a bit according to the command, the rising edges of the first and the second clock signals intclk1 and intclk2 are advanced, so that the rising edge phase of the first mixed clock signal int_clk generated by mixing the first and the second clock signals intclk1 and intclk2 can be advanced.

After that, when the DLL circuit is operated, the delays of the two delay lines 121 and 122 are independently tuned based on the results of the direct phase detectors 153 and 163, and when the DLL circuit is locked, the delays of the two delay lines 121 and 122 are tuned by the first direct phase detector 153. Accordingly, the path of the second clock signal intclk2, namely, the second phase mixer 161, the second delay model unit 162 and the second direct phase detector 163 provided in the second signal processor 160 are all turned off after the DLL locking is established. This turn-off process reduces power consumption.

Figure 3:
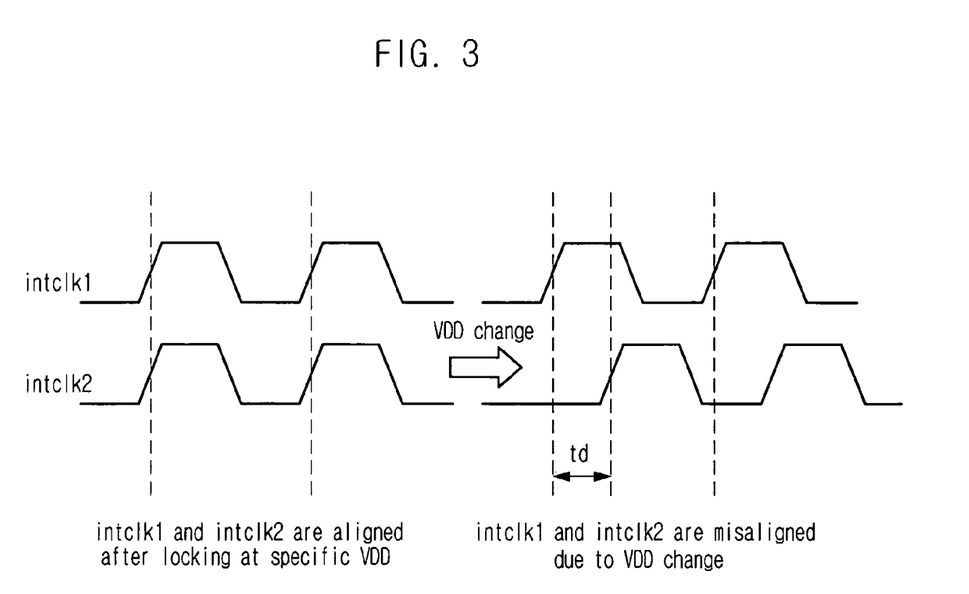
FIG. 3 is a timing diagram illustrating a phase change between a first and a second clock signals caused by a change of a power supply voltage after DLL locking.

However, in the conventional DLL circuit which can adjust a duty cycle, if a power supply voltage VDD is changed after the DLL locking, the phases of the first and the second clock signals intclk1 and intclk2 may be changed. During the DLL locking process, since the two delay lines 121 and 122 pass through independent locking processes, the number of unit delays through which the first clock signal intclk1 passes is different from that of unit delays through which the second clock signal intclk2 passes. A delay amount of one unit delay is increased at a low VDD rather than a high VDD. Therefore, when the power supply voltage VDD is changed, the phases of the first and the second clock signals intclk1 and intclk2 may be changed. FIG. 3 is a waveform diagram in which the phase between the first and the second clock signals intclk1 and intclk2 is changed by td due to the change of the power supply voltage VDD after the DLL locking.

Figure 4:
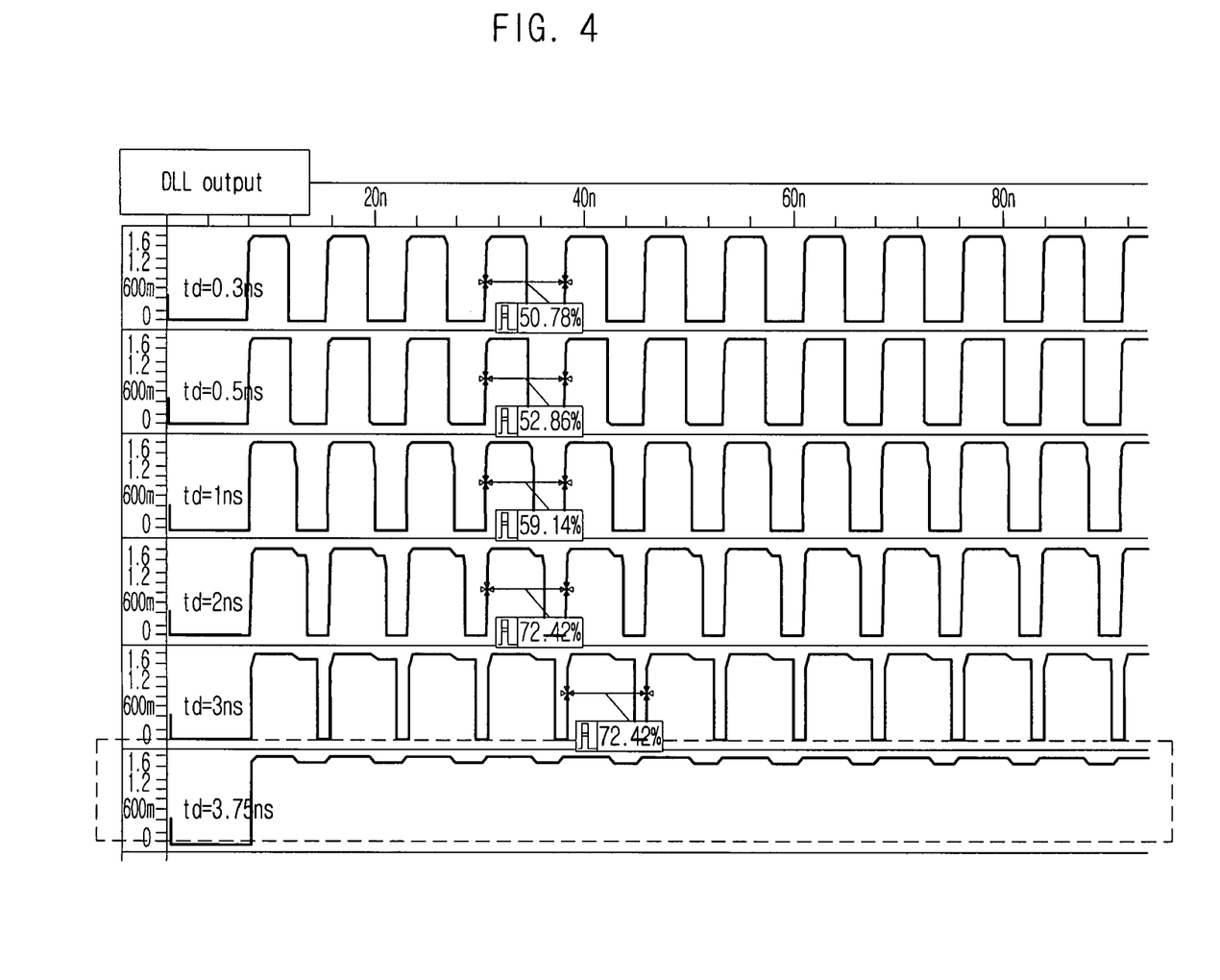
FIG. 4 is a timing diagram illustrating output waveforms of a DLL by a phase difference change value.

FIG. 4 is a diagram of output waveforms of the DLL in terms of td values when the phases of the first and the second clock signals intclk1 and intclk2 are misaligned by td due to the change of the power supply voltage VDD. It can be confirmed that the output waveforms of the DLL are changed according to the change of td, which lowers the performance of the DLL. Further, FIG. 4 shows that when td becomes tCK/2 (td=3.75 ns), the output of the DLL is not toggled at all.

In order to solve the foregoing problem, the path of the second clock signal intclk2, namely, the second phase mixer 161, the second delay model unit 162 and the second direct phase detector 163 provided in the second signal processor 160, may be turned on after the DLL locking. This, however, increases current consumption.

SUMMARY OF THE INVENTION

It is, therefore, an object of the present invention to prevent reduction of performance of a DLL due to phase changes of a first and a second clock signals by a change of a power supply voltage after DLL locking.

In accordance with one aspect of the present invention, there is provided a DLL circuit for preventing a malfunction caused by a change of a power supply voltage, which includes a first and a second delay lines and a first and a second signal processors for controlling the first and the second delay lines, and turns off the second signal processor after DLL locking, including: a phase comparator for generating a comparison signal notifying which of phases of a first clock signal of the first delay line and a second clock signal of the second delay line precedes the other; and a signal selector for inputting an output of the second signal processor to the second delay line before the DLL locking, and inputting the comparison signal of the phase comparator to the second delay line after the DLL locking.

In accordance with another aspect of the present invention, there is provided a DLL circuit for preventing a malfunction caused by a change of a power supply voltage, including: a buffer for receiving an external clock signal; a first delay line for receiving an input clock signal from the buffer, receiving a first comparison signal, and generating a first clock signal by delaying the input clock signal for a predetermined time; a second delay line for receiving the input clock signal from the buffer, receiving a second comparison signal or a comparison signal from a phase comparator, and generating a second clock signal by delaying the input clock signal for a predetermined time; a phase detector for receiving inverted values of the first and the second clock signals, and generating a phase detection signal notifying which of the falling edges of the clock signals precedes the other; a mix controller for deciding DLL locking or unlocking based on the first and the second comparison signals, outputting an on/off signal depending on the DLL locking or unlocking, and providing a weight determined by using the phase detection signal; a first signal processor for receiving the weight, the first and the second clock signals to generates a first compensated clock signal by using the weight and the clock signals, and receiving the external clock signal to generate the first comparison signal by comparing the external clock signal with the first compensated clock signal; a second signal processor for receiving the weight, the first and the second clock signals to generate a second compensated clock signal by using the weight and the clock signals, and receiving the external clock signal to generate the second comparison signal by comparing the external clock signal with the second compensated clock signal, wherein the second signal processor is activated or inactivated in response to the on/off signal; the phase comparator for generating the comparison signal notifying which of phases of the first clock signal of the first delay line and the second clock signal of the second delay line precedes the other; and a signal selector for inputting the second comparison signal to the second delay line before the DLL locking, and inputting the comparison signal of the phase comparator to the second delay line after the DLL locking.

Other objectives and advantages of the invention will be understood by the following description and will also be appreciated by the embodiments of the invention more clearly.

BRIEF DESCRIPTION OF THE DRAWINGS

The above and other objects and features of the instant invention will become apparent from the following description of preferred embodiments taken in conjunction with the accompanying drawings, in which.

DESCRIPTION OF SPECIFIC EMBODIMENTS

In accordance with the present invention, after a DLL locking, delay amount of a second delay line can be independently controlled by comparing a first and a second clock signals. As a result, a performance of a DLL circuit can be maintained by preventing phases of the first and the second clock signals from being misaligned due to change of a power supply voltage after the DLL locking.

Further, the conventional DLL circuit must turn on a second signal processor to prevent the performance from being reduced due to the change of the power supply voltage after the DLL locking, which results in large current consumption. However, in accordance with the present invention, the DLL circuit can improve the performance without consuming much current.

Hereinafter, preferred embodiments of the present invention will be described in detail with reference to the accompanying drawings so that the invention can readily be carried out by those skilled in the art.

Figure 5:
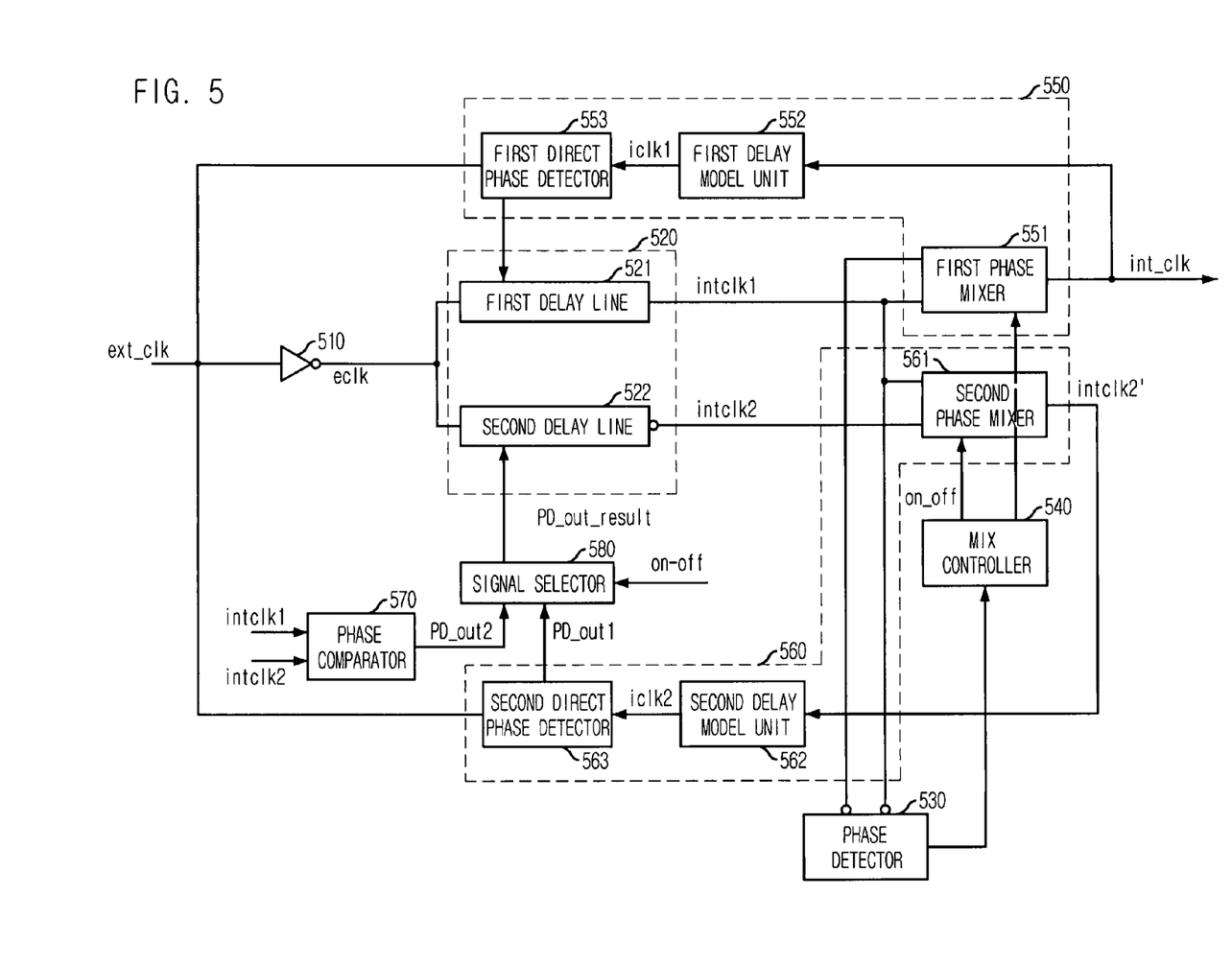
FIG. 5 is a block diagram of a DLL circuit for preventing a malfunction caused by a change of a power supply voltage in accordance with a preferred embodiment of the present invention.

FIG. 5 is a block diagram of the DLL circuit for preventing malfunction caused by the change of the power supply voltage in accordance with a preferred embodiment of the present invention. The DLL circuit includes previous first and second delay lines 521 and 522 and turns off a second signal processor 560 for controlling the second delay line 522 after DLL locking, and further includes a phase comparator 570 and a signal selector 580.

The phase comparator 570 receives a first clock signal intclk1 which is an output signal of the first delay line 521, and a second clock signal intclk2 which is an output signal of the second delay line 522, and outputs a comparison signal PD_out2 notifying which of phases of the two signals precedes the other.

The signal selector 580 inputs an output PD_out1 of the second signal processor 560 (which is an output of a second direct phase detector 563) to the second delay line 522 before the DLL locking, and inputs the comparison signal PD_out2 of the phase comparator 570 to the second delay line 522 after the DLL locking.

Figure 6:
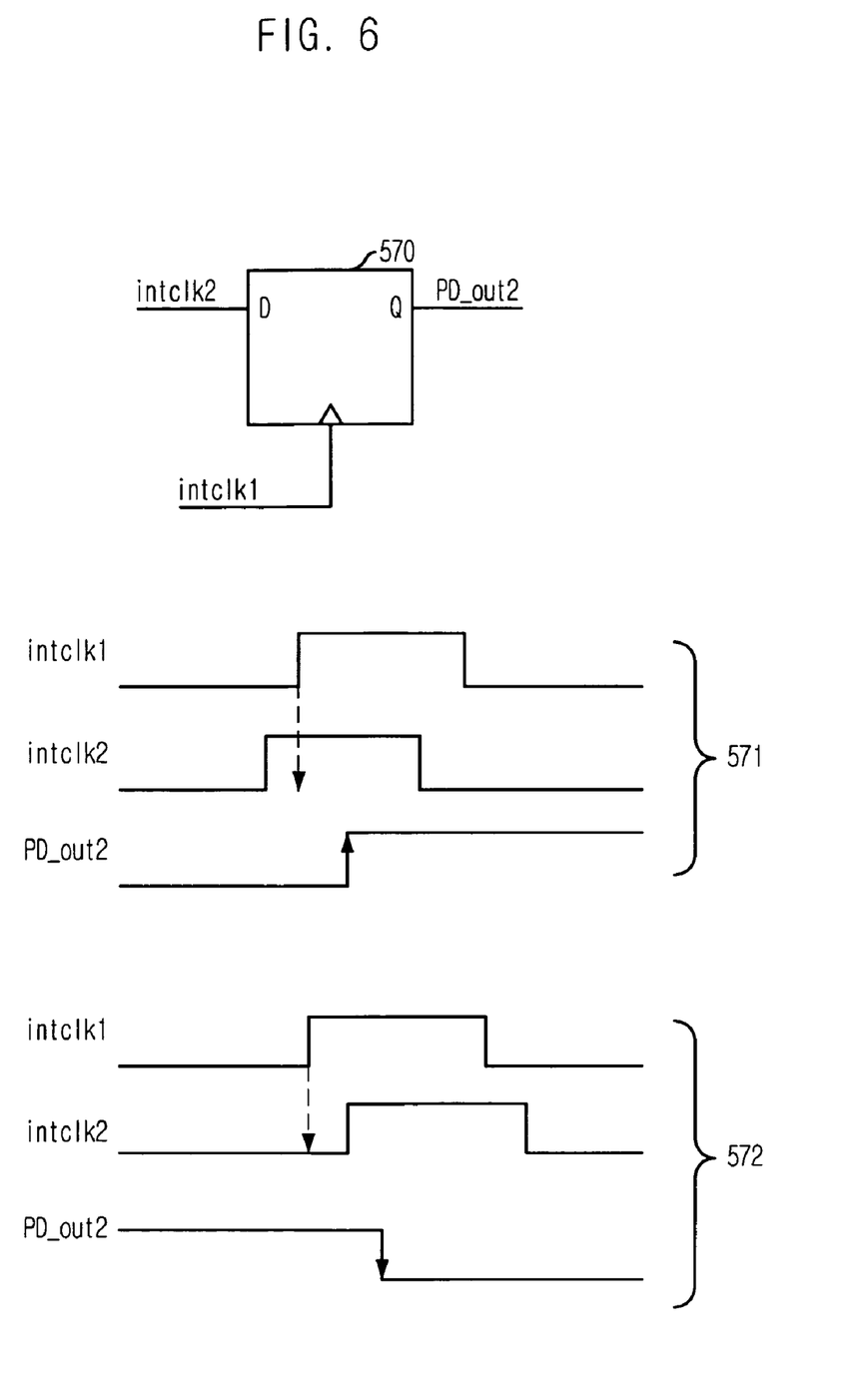
FIG. 6 is a diagram including a configuration and operation of a phase comparator shown in FIG. 5.

FIG. 6 is a diagram for describing a configuration and operation of the phase comparator shown in FIG. 5. The phase comparator 570 may be comprised of a flip-flop circuit. That is, the second clock signal intclk2 is input to a terminal D, the first clock signal intclk1 is input to a clock terminal clk, and the phase comparison signal PD_out2 is output via a terminal Q.

The phase comparator 570 as configured above outputs the phase comparison signal PD_out2, by sampling the state of the second clock signal intclk2 at the rising edge of the first clock signal intclk1.

In other words, when the second clock signal intclk2 is high at the rising edge of the first clock signal intclk1, the high signal PD_out1 is output. This means that the phase of the second clock signal intclk2 proceeds (see reference numeral 571).

Further, when the second clock signal intclk2 is low at the rising edge of the first clock signal intclk1, the low signal PD_out1 is output. This implies that the phase of the second clock signal intclk2 lags (see reference numeral 572).

Figure 7:
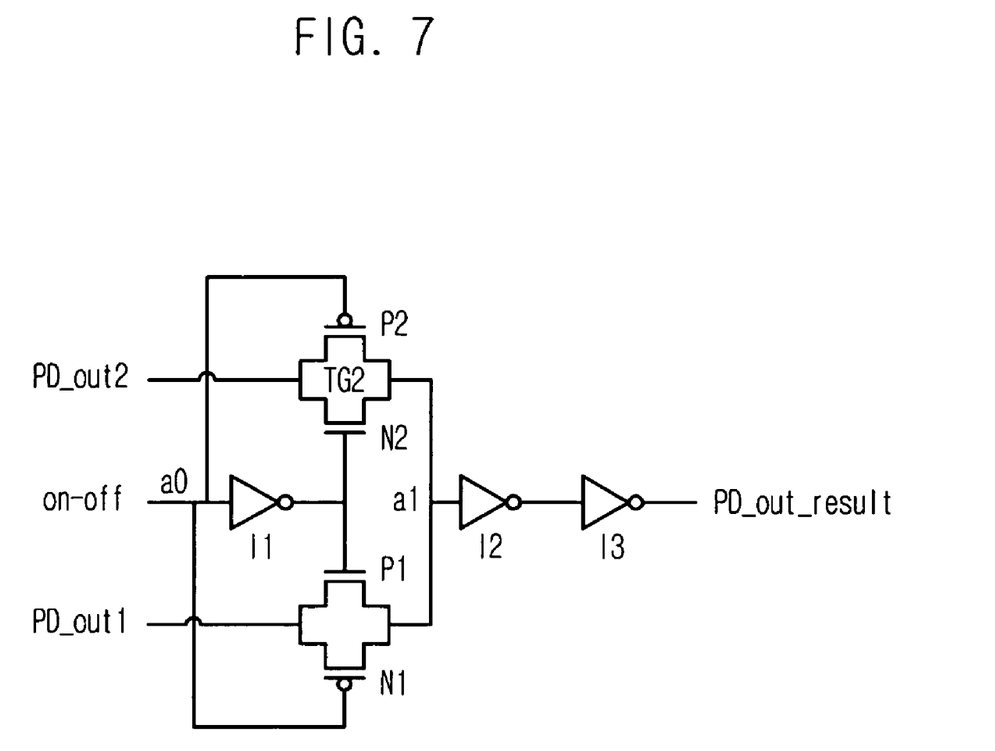
FIG. 7 is a schematic circuit diagram of a signal selector depicted in FIG. 5.

FIG. 7 is schematic circuit diagram of the signal selector depicted in FIG. 5. The signal selector 580 receives an on/off signal on_off for turning on or off the second signal processor 560. Upon receipt of the on signal before the DLL locking, the signal selector 580 supplies the output PD_out1 of the second signal processor 560 to the second delay line 522, and upon receipt of the off signal after the DLL locking, the signal selector 580 supplies the output PD_out2 of the phase comparator 570 to the second delay line 522.

The signal selector 580 is provided with first and second transmission lines TG1 and TG2. The first transmission line TG1 is turned on in response to the on signal to supply the output PD_out1 of the second signal processor 560, and the second transmission line TG2 is turned on in response to the off signal to provide the output PD_out2 of the phase comparator 570.

More particularly, the first transmission line TG1 includes a first NMOS transistor N1 and a first PMOS transistor P1. The first NMOS transistor N1 receives the on/off signal on_off via its gate and supplies the output PD_out1 of the second signal processor 560 via its drain and source. The first PMOS transistor P1 is connected in parallel with the first NMOS transistor N1 and receives via its gate a signal obtained by inverting the on/off signal on_off by an inverter I1.

The second transmission line TG2 includes a second NMOS transistor N2 and a second PMOS transistor P2. The second PMOS transistor P2 receives the on/off signal on_off via its gate and supplies the output PD_out2 of the phase comparator 570 via its drain and source. The second NMOS transistor N2 is connected in parallel with the second PMOS transistor P2 and receives a signal obtained by inverting the on/off signal on_off by an inverter I1 via its gate.

Accordingly, when the on ('high') signal is input to a terminal a0, the first PMOS and the first NMOS transistors P1 and N1 are turned on to output the signal PD_out1 to a terminal a1, and when the off ('low') signal is input to the terminal a0, the second PMOS and the second NMOS transistors P2 and N2 are turned on to output the signal PD_out2 to the terminal a1.

The signal supplied to the terminal a1 can be output directly as the output signal of the signal selector 580. But, as shown in FIG. 7, it is also possible to invert the signal of the terminal a1 in an even number by using an even number of inverters (I2 and I3 in the drawing) connected in series, and output the inverted signal to an output terminal PD_out_result.

In the DLL circuit of the present invention, before the DLL locking, the signal selector 580 selects the output PD_out1 of the existing second signal processor 560, and supplies it to the second delay line 522. Therefore, the DLL circuit is operated in the same manner as the conventional DLL circuit before the DLL locking.

After the DLL locking, however, when the second signal processor 560 is turned off, the signal selector 580 selects the output PD_out2 of the phase comparator 570, and delivers the same to the second delay line 522.

Therefore, when the phase of the second clock signal intclk2 precedes the phase of the first clock signal intclk1 and the output of the phase comparator 570 is high, the high signal is output to the second delay line 522 to increase the delay of the second delay line 522. On the contrary, when the phase of the first clock signal intclk1 precedes the phase of the second clock signal intclk2 and the output of the phase comparator 570 is low, the low signal is input to the second delay line 522 to decrease the delay of the second delay line 522. In this manner, the DLL circuit of the present invention can synchronize the phases of the first and the second clock signals intclk1 and intclk2.

While the present invention has been described with respect to the particular embodiments, it will be apparent to those skilled in the art that various changes and modifications may be made without departing from the spirit and scope of the invention as defined in the following claims.

What is claimed is:

1. A Delay Locked Loop (DLL) circuit, comprising:
   a first and a second delay lines for generating first and second clock signals;
   a first and a second signal processors for generating a compensated clock signal by controlling the first and the second delay lines in response to the first and second clock signals;
   a phase comparator for generating a comparison signal notifying which of phases of the first clock signal and the second clock signal precedes the other; and
   a signal selector for inputting an output of the second signal processor to the second delay line before the DLL locking, and inputting the comparison signal of the phase comparator to the second delay line after the DLL locking.

2. The DLL circuit as recited in claim 1, wherein the phase comparator detects the phase of the second clock signal at a rising edge of the first clock signal to output the detected phase as the comparison signal.

3. The DLL circuit as recited in claim 1, wherein the phase comparator is a flip-flop that receives the first clock signal via a terminal D and the second clock signal via a clock terminal, and outputs the comparison signal via a terminal Q.

4. The DLL circuit as recited in claim 1, wherein the signal selector receives an on/off signal for turning on or off the second signal processor, inputs an output of the second signal processor to the second delay line in response to the on signal, and inputs an output of the phase comparator to the second delay line in response to the off signal.

5. The DLL circuit as recited in claim 4, wherein the signal selector turns on a first transmission line for supplying the output of the second signal processor in response to the on signal, and turns on a second transmission line for supplying the output of the phase comparator in response to the off signal.

6. The DLL circuit as recited in claim 5, wherein the first transmission line includes a first NMOS transistor that receives the on/off signal via a gate and supplies the output of the second signal processor via a drain and a source, and a second PMOS transistor that is connected in parallel with the first NMOS transistor of the first transmission line and receives an inverted signal of the on/off signal via a gate; and
   the second transmission line includes a second PMOS transistor that receives the on/off signal via a gate and supplies the output of the phase comparator, and a second NMOS transistor that is connected in parallel with the second PMOS transistor of the second transmission line and receives an inverted signal of the on/off signal via a gate.

7. The DLL circuit as recited in claim 6, wherein the signal selector inverts the signals supplied to the first and the second transmission lines in an even number by an even number of inverters connected in series, and outputs the inverted signals.

8. A DLL circuit, comprising:
   a buffer for receiving an external clock signal;
   a first delay line for receiving an input clock signal from the buffer, receiving a first comparison signal, and generating a first clock signal by delaying the input clock signal for a predetermined time;
   a second delay line for receiving the input clock signal from the buffer, receiving a second comparison signal or a comparison signal from a phase comparator, and generating a second clock signal by delaying the input clock signal for a predetermined time;
   a phase detector for receiving inverted values of the first and the second clock signals, and generating a phase detection signal notifying which of the falling edges of the clock signals precedes the other;
   a mixed controller for deciding DLL locking or unlocking based on the first and the second comparison signals, outputting an on/off signal depending on the DLL locking or unlocking, and providing a weight determined by using the phase detection signal;
   a first signal processor for receiving the weight and the first and the second clock signals to generate a first compensated clock signal by using the weight and the clock signals, and receiving the external clock signal to generate the first comparison signal by comparing the external clock signal with the first compensated clock signal;
   a second signal processor for receiving the weight and the first and the second clock signals to generate a second compensated clock signal by using the weight and the clock signals, and receiving the external clock signal to generate the second comparison signal by comparing the external clock signal with the second compensated clock signal, wherein the second signal processor is activated or inactivated in response to the on/off signal; and
   a signal selector for inputting the second comparison signal to the second delay line before the DLL locking, and inputting the comparison signal of the phase comparator to the second delay line after the DLL locking.

9. The DLL circuit as recited in claim 8, wherein the phase comparator detects the phase of the second clock signal at a rising edge of the first clock signal to output the detected phase as the comparison signal.

10. The DLL circuit as recited in claim 8, wherein the phase comparator is a flip-flop that receives the first clock signal via a terminal D and the second clock signal via a clock terminal, and outputs the comparison signal via a terminal Q.

11. The DLL circuit as recited in claim 8, wherein the signal selector receives an on/off signal for turning on or off the second signal processor, inputs an output of the second signal processor to the second delay line in response to the on signal, and inputs an output of the phase comparator to the second delay line in response to the off signal.

12. The DLL circuit as recited in claim 11, wherein the signal selector turns on a first transmission line for supplying the output of the second signal processor in response to the on signal, and turns on a second transmission line for supplying the output of the phase comparator in response to the off signal.

13. The DLL circuit as recited in claim 12, wherein the first transmission line includes a first NMOS transistor that receives the on/off signal via a gate and supplies the output of the second signal processor via a drain and a source, and a first PMOS transistor that is connected in parallel with the first NMOS transistor of the first transmission line and receives an inverted signal of the on/off signal via a gate; and the second transmission line includes a second PMOS transistor that receives the on/off signal via a gate and supplies the output of the phase comparator, and a second NMOS transistor that is connected in parallel with the second PMOS transistor of the second transmission line and receives an inverted signal of the on/off signal via a gate.

14. The DLL circuit as recited in claim 13, wherein the signal selector inverts the signals supplied to the first and the second transmission lines in an even number by an even number of inverters connected in series, and outputs the inverted signals.

* * * * *